(12) United States Patent
Tunks et al.

(10) Patent No.: US 12,349,311 B2
(45) Date of Patent: Jul. 1, 2025

(54) SYSTEMS AND METHODS FOR FILLING AND DRAINING LIQUID OF A LIQUID COOLING SYSTEM

(71) Applicant: Dell Products L.P., Round Rock, TX (US)

(72) Inventors: Eric M. Tunks, Austin, TX (US); Ben J. Sy, Austin, TX (US); Camden Schreeder, Austin, TX (US); Ian Greener, Morton, IL (US); Nathaniel Honl, College Station, TX (US); Andre Branco, Redondo Beach, CA (US); Laura Smith, Metairie, LA (US); Pavel Lazurenko, Hermosa Beach, CA (US); Jackson Colvin, Magnolia, TX (US)

(73) Assignee: Dell Products L.P., Round Rock, TX (US)

( * ) Notice: Subject to any disclaimer, the term of this patent is extended or adjusted under 35 U.S.C. 154(b) by 384 days.

(21) Appl. No.: 17/876,296

(22) Filed: Jul. 28, 2022

(65) Prior Publication Data

US 2024/0040745 A1    Feb. 1, 2024

(51) Int. Cl.
*H05K 7/20* (2006.01)
*G05D 7/06* (2006.01)

(52) U.S. Cl.
CPC ....... *H05K 7/20272* (2013.01); *G05D 7/0676* (2013.01)

(58) Field of Classification Search
CPC .................. H05K 7/20272; G05D 7/0676
See application file for complete search history.

(56) References Cited

U.S. PATENT DOCUMENTS

| 5,522,452 A | * | 6/1996 | Mizuno | H01L 23/4336 |
| | | | | 165/286 |
| 2013/0333865 A1 | * | 12/2013 | Goth | H05K 7/20836 |
| | | | | 165/104.31 |
| 2020/0187388 A1 | * | 6/2020 | Chiu | H05K 7/20145 |

* cited by examiner

*Primary Examiner* — Gary Collins
(74) *Attorney, Agent, or Firm* — Jackson Walker L.L.P.

(57) ABSTRACT

A method for filling and draining a liquid cooling system, may include, in a fill mode of the system, causing a pump to drive liquid from a reservoir configured to hold the liquid, through a first fluidic conduit configured to couple to a first pair of fluid disconnects of a manifold of the liquid cooling system, through the first pair of fluid disconnects, to fluidic channels of the liquid cooling system fluidically coupled to the first pair of fluid disconnects, and in a drain mode of the system, causing the pump to drive liquid present in the fluidic channels to flow from the fluidic channels, through the first pair of fluid disconnects, through the first fluidic conduit, and to the reservoir.

23 Claims, 3 Drawing Sheets

SYSTEMS AND METHODS FOR FILLING AND DRAINING LIQUID OF A LIQUID COOLING SYSTEM

TECHNICAL FIELD

The present disclosure relates in general to information handling systems, and more particularly to filling and draining liquid of a liquid-cooled information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

A propylene glycol and water solution is a common fluid used for liquid cooling. While popular, such fluid poses challenges. For instance, the fluid solution may freeze at extreme temperatures that it may be exposed to during transportation during winter months in cold climates as well as during air transportation. As an example, a solution of 75% water and 25% propylene glycol may freeze between −10° C. and −20° C., at which point it may expands by ~10%. However, reliability standards may require reliability at −40° C. during non-operation. Expansion during freezing can severely damage cold plates and the supporting liquid system as it ships to an end use site on account of being trapped within a "closed" volume.

SUMMARY

In accordance with the teachings of the present disclosure, the disadvantages and problems associated with use of liquid cooling systems in extreme environments may be substantially reduced or eliminated.

In accordance with embodiments of the present disclosure, a system for filling and draining a liquid cooling system may include a reservoir configured to hold liquid, a pump fluidically coupled to the reservoir, a first fluidic conduit configured to couple to a first pair of fluid disconnects of a manifold of the liquid cooling system, a second fluidic conduit configured to couple to a second pair of fluid disconnects of a manifold of the liquid cooling system, and a processor communicatively coupled to the pump and configured to, in a fill mode of the system, drive liquid from the reservoir, through the first fluidic conduit, through the first pair of fluid disconnects, to fluidic channels of the liquid cooling system fluidically coupled to the first pair of fluid disconnects, and in a drain mode of the system, cause the pump to drive liquid present in the fluidic channels to flow from the fluidic channels, through the first pair of fluid disconnects, through the first fluidic conduit, and to the reservoir.

In accordance with these and other embodiments of the present disclosure, a method for filling and draining a liquid cooling system, may include in a fill mode of the system, causing a pump to drive liquid from a reservoir configured to hold the liquid, through a first fluidic conduit configured to couple to a first pair of fluid disconnects of a manifold of the liquid cooling system, through the first pair of fluid disconnects, to fluidic channels of the liquid cooling system fluidically coupled to the first pair of fluid disconnects, and in a drain mode of the system, causing the pump to drive liquid present in the fluidic channels to flow from the fluidic channels, through the first pair of fluid disconnects, through the first fluidic conduit, and to the reservoir.

In accordance with these and other embodiments of the present disclosure, a method may include fluidically coupling a reservoir configured to hold liquid to a pump, fluidically coupling to the pump a first fluidic conduit configured to couple to a first pair of fluid disconnects of a manifold of a liquid cooling system, fluidically coupling to the reservoir a second pair of fluid disconnects of a manifold of the liquid cooling system, and communicatively coupling a processor to the pump, wherein the processor is configured to: in a fill mode of the system, drive liquid from the reservoir, through the first fluidic conduit, through the first pair of fluid disconnects, to fluidic channels of the liquid cooling system fluidically coupled to the first pair of fluid disconnects, and in a drain mode of the system, cause the pump to drive liquid present in the fluidic channels to flow from the fluidic channels, through the first pair of fluid disconnects, through the first fluidic conduit, and to the reservoir.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
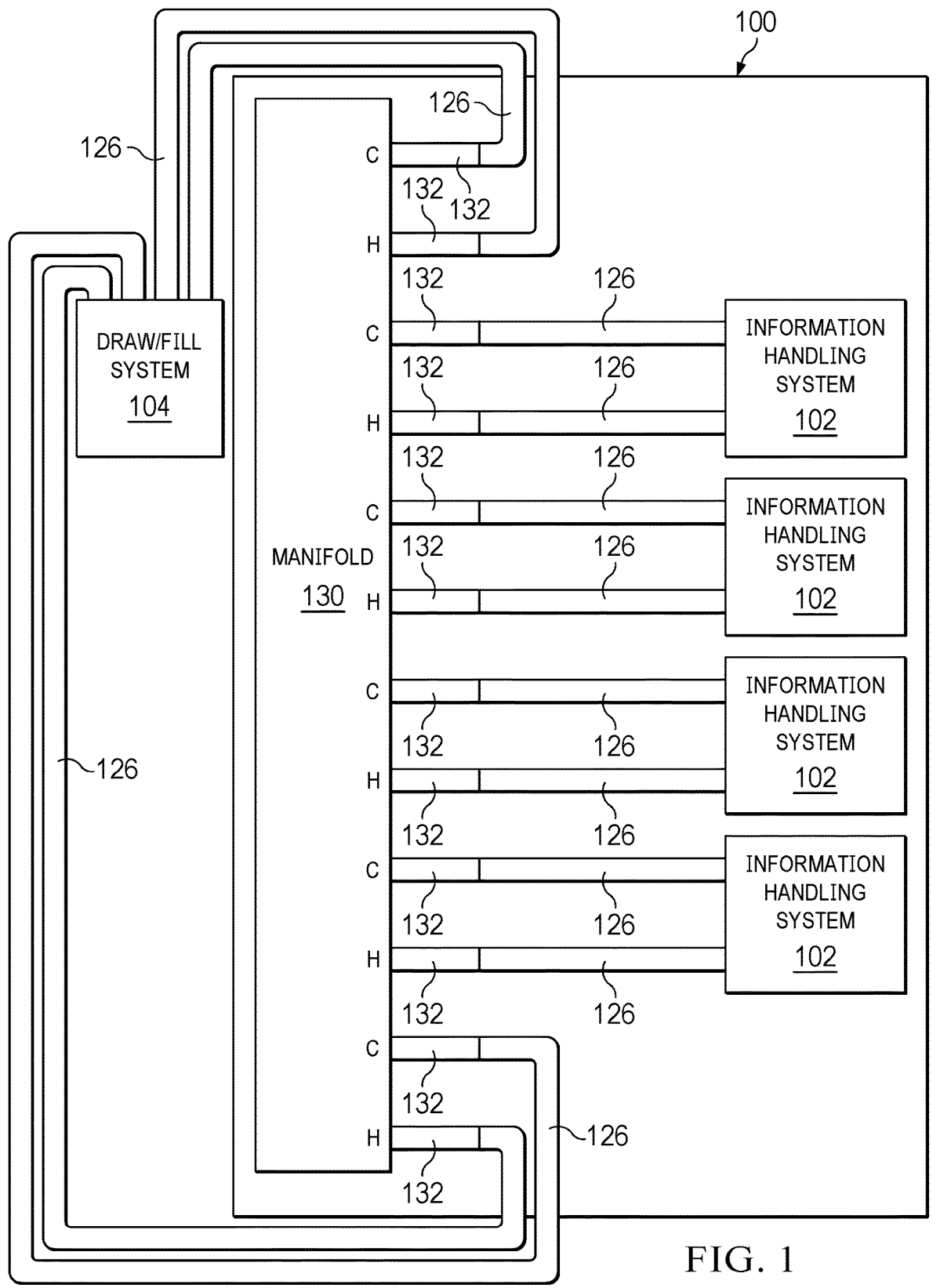
FIG. 1 illustrates a block diagram of selected components of an example server enclosure housing a plurality of information handling systems and a drain/fill system fluidically coupled to such server enclosure and information handling systems, in accordance with embodiments of the present disclosure.
Figure 2A:
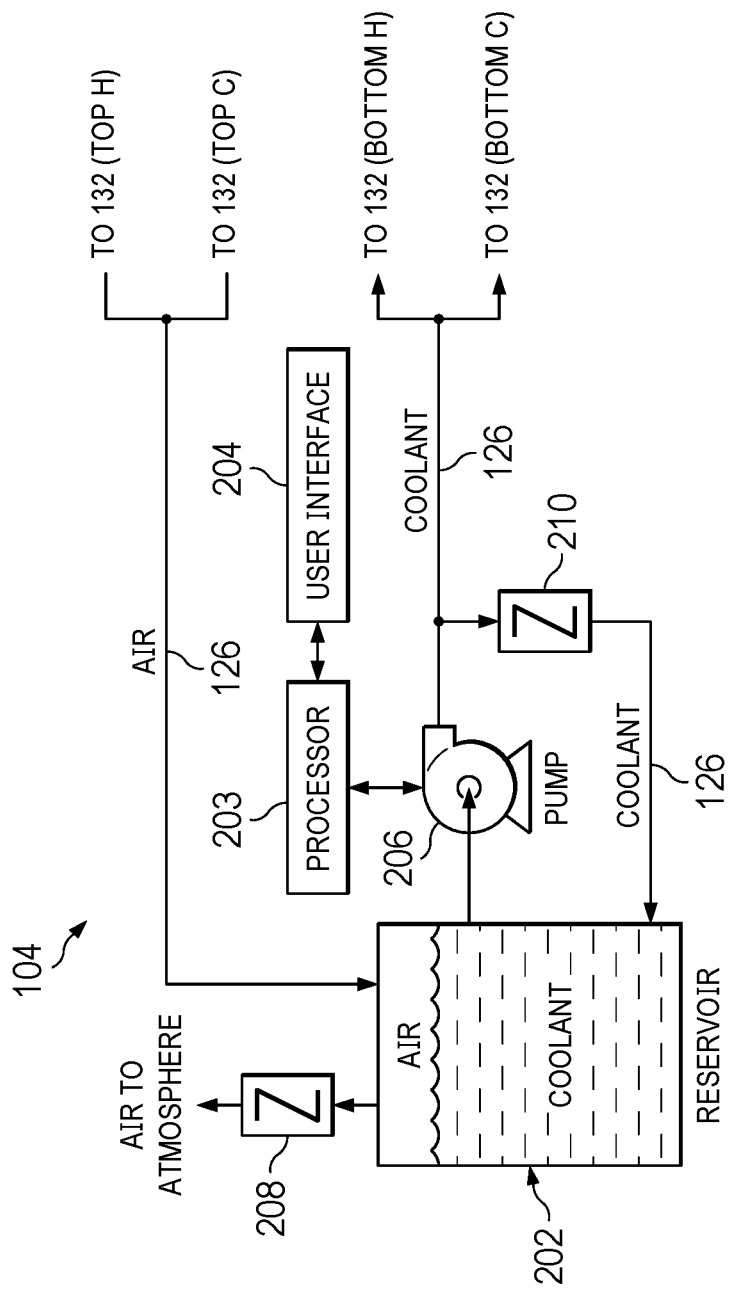
FIG. 2A illustrates a block diagram of selected components of an example drain/fill system depicting operation in a fill mode, in accordance with embodiments of the present disclosure.
Figure 2B:
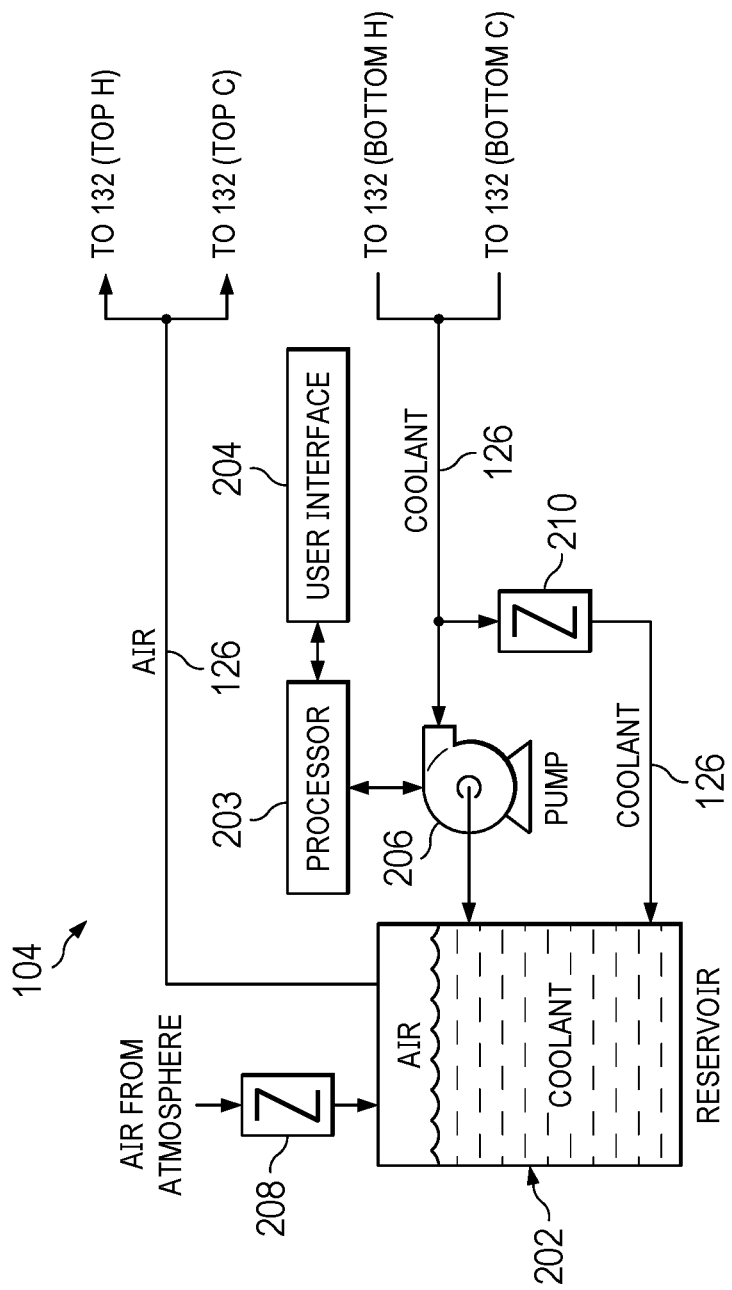
FIG. 2B illustrates a block diagram of selected components of an example drain/fill system depicting operation in a drain mode, in accordance with embodiments of the present disclosure.

Preferred embodiments and their advantages are best understood by reference to FIGS. 1 through 2B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of selected components of an example server enclosure 100 housing a plurality of information handling systems 102 and a drain/fill system 104 fluidically coupled to such server enclosure 100 and information handling systems 102, in accordance with embodiments of the present disclosure.

Enclosure 100 may comprise any suitable housing or other container for housing a plurality of information handling systems 102, and may be constructed from any suitable materials, including metal and/or plastic. As shown in FIG. 1, in addition to housing a plurality of information handling systems 102, enclosure 100 may also include a manifold 130 and a plurality of fluidic conduits 126.

Manifold 130 may include any system, device, or apparatus configured to receive coolant fluid from a centralized fluid cooling and distribution system (e.g., a radiator for cooling coolant fluid, not explicitly shown in FIG. 1), distribute (e.g., under pressure applied from a pump of the centralized fluid cooling and distribution system) such coolant fluid to the plurality of information handling systems 102 via fluidic conduits 126 fluidically coupled to manifold 130, receive such coolant fluid back from information handling systems 102 via fluidic conduits 126 fluidically coupled to manifold 130, and then distribute coolant fluid back to the centralized fluid cooling and distribution system. As shown in FIG. 1, manifold 130 may include a plurality of pairs of quick disconnects 132. One (C) of each pair of quick disconnects 132 may be configured to receive chilled fluid from a centralized fluid cooling and distribution system or deliver such chilled fluid to an information handling system 102 while the other (H) of each pair of quick disconnects 132 may be configured to receive warmed fluid from an information handling system 102 or deliver such warmed fluid to the centralized fluid cooling and distribution system. In some embodiments, quick disconnects 132 may be "dripless" disconnects in which a valve or other feature automatically closes when a fluidic conduit 126 is decoupled from the quick disconnect 132 and automatically opens when a fluidic conduit 126 is coupled to the quick disconnect 132.

Thus, in operation, manifold 130 may receive cooled coolant fluid from the centralized fluid cooling and distribution system (e.g., a radiator) and convey the coolant fluid to each of information handling systems 102.

Each information handling system 102 may have its own internal coolant fluid distribution network, such that coolant fluid distributed to each information handling system 102 may cool components of such information handling system 102 on account of heat transfer from such components to the coolant fluid. After flowing through the internal coolant fluid distribution network of an information handling system 102, the heated coolant fluid may return to manifold 130. Manifold 130 may be constructed to isolate the cooled coolant fluid received from the centralized fluid cooling and distribution system from the heated coolant fluid received from information handling systems 102. Manifold 130 may further route the heated coolant fluid back to the centralized fluid cooling and distribution system, where the coolant fluid may be cooled and recirculated back to manifold 130.

When filling or draining coolant fluid of server enclosure 100 and its information handling systems 102, drain/fill system 104 may be fluidically coupled to manifold 130. For example, as shown in FIG. 1, drain/fill system 104 may be fluidically coupled via a fluidic conduit 126 to both quick disconnects 132 of a quick disconnect pair located at a "top" of manifold 130 and fluidically coupled via another fluidic conduit 126 to both quick disconnects 132 of a quick disconnect pair located at a "bottom" of manifold 130.

Drain/fill system 104 may comprise any suitable system, device, or apparatus configured to operate in a fill mode to increase a volume of liquid coolant within fluidic channels of server enclosure 100 and conversely operate in a drain mode to decrease the volume of liquid coolant within fluidic channels of server enclosure 100, as described in greater detail below.

Advantageously, drain/fill system 104 may enable for effective addition and removal of liquid coolant of fluidic channels of server enclosure 100 in a closed fluidic system, allowing users/technicians to avoid direct contact with coolant fluid, as is a risk with manual approaches to adding and removing coolant fluid.

FIG. 2A illustrates a block diagram of selected components of an example drain/fill system 104 depicting operation in a fill mode, in accordance with embodiments of the present disclosure. As shown in FIG. 2A, drain/fill system 104 may comprise reservoir 202, processor 203, user interface 204, pump 206, check valve 208, check valve 210, and a plurality of fluidic conduits 126.

Reservoir 202 may comprise any suitable system, device, or apparatus for containing coolant fluid for storage outside of fluidic channels of server enclosure 100. Accordingly, reservoir 202 may include a plastic container, a glass container, or any other container made of a material that is chemically non-reactive with the coolant fluid. In operation, reservoir 202 may store coolant drained from server enclosure 100 and/or store coolant fluid to be filled into server enclosure 100. As shown in FIG. 2A, reservoir 202 may be fluidically coupled to the top pair of quick disconnects 132 of manifold 130 via a fluidic conduit 126 (which fluidic conduit 126 may fork or branch to allow 2-to-1 coupling between reservoir 202 and quick disconnects 132). As also shown in FIG. 2A, reservoir 202 may be fluidically coupled to the top pair of quick disconnects 132 of manifold 130 via a pump 206 and one or more fluidic conduits 126 (e.g., which one of fluidic conduits may fork or branch to allow 2-to-1 coupling between quick disconnects 132 and pump 206 or allow 2-to-2 coupling between quick disconnects 132 on one hand and pump 206 and check valve 210 on the other hand).

Processor 203 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 203 may interpret and/or execute program instructions and/or process data stored in a memory and/or other computer-readable media. In particular, processor 203 may control operation of pump 206, in order to cause pump 206 to regulate a volume of fluid within fluidic channels of server enclosure 100 at desired levels, as described in greater detail below.

User interface 204 may be communicatively coupled to processor 203, and may include any system, device, or apparatus configured to communicate information to and/or receive input from, a user, technician, or other person interfacing with user interface 204. For example, in its simplest form, user interface 204 may include a switch for powering on and powering off drain/fill system 104 and its components and/or for selecting an operational mode (e.g., drain or fill) for drain/fill system 104. In such simple form, user interface 204 may include a basic display screen for displaying operational information associated with drain/fill system 104. In more complex forms, user interface 204 may include a keypad and/or touch screen for receiving input from a person (e.g., thus allowing more granular input such as desired volume of coolant fluid to be transferred) and/or may include an advanced display screen for displaying operational information (e.g., highly detailed information) associated with drain/fill system 104.

Pump 206 may be fluidically coupled to one or more fluidic conduits 126 and may comprise any mechanical or electro-mechanical system, apparatus, or device operable to produce a flow of fluid (e.g., fluid in one or more conduits 126). For example, pump 206 may produce fluid flow by applying a pressure to fluid in fluidic conduits 126. As described above, operation of pump 206 may be controlled by processor 203 which may control electro-mechanical components of pump 206 in order to produce a desired rate of coolant flow.

In some embodiments, pump 206 may comprise a peristaltic pump, configured to convey a particular volumetric increment of coolant fluid per each rotation of the peristaltic pump. Further, in such embodiments, pump 206 may communicate to processor 203 information (e.g., as sensed by a Hall sensor, magnetic sensor, or other appropriate sensor) regarding the number of rotations undertaken by such peristaltic pump, such that processor 203 may accurately track the volume of coolant fluid added or removed from fluidic channels of server enclosure 100. Instead of a peristaltic pump, pump 206 may be implemented with a traditional, two-way pump, wherein drain/fill system 104 may include a flow meter integrated within its fluid flow path in order to monitor the volumetric flow of fluid through pump 206.

Check valve 208 may be interfaced between reservoir 202 and air ambient to reservoir 202. In response to an air pressure between the internal space of reservoir 202 and the atmospheric pressure differing by a threshold amount, check valve 208 may open, allowing air to vent from reservoir 202 to the ambient air (if pressure is greater inside reservoir 202) or allowing air to enter reservoir 202 from the atmosphere. Such check valve 208 may ensure that air is purged from reservoir 202 to reduce or eliminate the possibility of creating air bubbles within the flow of coolant fluid and generating undesirable pressure in reservoir 202 or the fluidic channels of drain/fill system 104 and/or server enclosure 100.

Check valve 210 may be interfaced between pump 206 and reservoir 202 and may be configured to open in order to allow flow of coolant fluid pumped from reservoir 202 to be recirculated to reservoir 202 if a pressure within a fluidic channel coupled to check valve 210 rises above a threshold pressure level, thus serving as a fail-safe to prevent or reduce the likelihood of excessive pressure in the fluidic channels of drain/fill system 104 and/or server enclosure 100 that could lead to ruptures and/or leaks of such fluidic channels.

In the fill mode, processor 203 may cause pump 206 to drive flow of coolant fluid from reservoir 202 to the "bottom" pair of quick disconnects 132 of manifold 130, thus increasing a volume of the coolant fluid within fluidic channels within server enclosure 100. In some embodiments, such fill mode may end due to a user's manual interaction with user interface 204 (e.g., toggling of a switch). In other embodiments, such fill mode may end in response to the volume increasing by a programmable amount set by a user via user interface 204.

Pressure induced within such fluidic channels as a result of the increased volume of coolant fluid in fluidic channels within server enclosure 100 may cause air present in fluidic channels within server enclosure 100 to flow from the "top" pair of quick disconnects 132 of manifold 130, into reservoir 202. If a pressure difference between reservoir 202 and ambient air increases beyond a threshold amount, check valve 208 may open to equalize such pressure within reservoir 202. Further, as mentioned above, should the pressure within the fluidic conduit 126 coupled to check valve 210 exceed a threshold pressure, check valve 210 may open in order that some or all coolant fluid being driven by pump 206 may re-enter reservoir 202 without first being conveyed to server enclosure 100.

FIG. 2B illustrates a block diagram of selected components of example drain/fill system 104 depicting operation in a drain mode, in accordance with embodiments of the present disclosure. In the drain mode, processor 203 may cause pump 206 to drive flow of coolant fluid from the "bottom" pair of quick disconnects 132 of manifold 130 to reservoir 202, thus decreasing a volume of the coolant fluid within fluidic channels within server enclosure 100. In some embodiments, such drain mode may end due to a user's manual interaction with user interface 204 (e.g., toggling of a switch). In other embodiments, such drain mode may end in response to the volume decreasing by a programmable amount set by a user via user interface 204.

Pressure induced within reservoir 202 as a result of the increased volume of coolant fluid in reservoir 202 may cause air present in reservoir 202 to flow from reservoir 202 into the "top" pair of quick disconnects 132 of manifold 130, such that air may enter fluidic channels within server enclosure 100. If a pressure difference between reservoir 202 and ambient air increases beyond a threshold amount, check valve 208 may open to equalize such pressure within reservoir 202.

Although the foregoing contemplates, for purposes of clarity and exposition, that reservoir 202 is fluidically coupled to quick disconnects 132 of manifold 130 at the "top" and "bottom" pairs of quick disconnects 132, it is understood that reservoir 202 may be fluidically coupled to any suitable pairs of quick disconnects 132 of manifold 130.

In some embodiments, drain/fill system 104 may be implemented as a mobile system or device. For example, in some embodiments, reservoir 202 and electronic components of drain/fill system 104 may rest on a wheeled cart that may be pushed by a person to be in proximity with a desired server enclosure 100. As another example, for sufficient small enough volumes of coolant fluid, reservoir 202 and electronic components of drain/fill system 104 may be integrated within a hand-held device.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system for filling and draining a liquid cooling system, comprising:
 a reservoir configured to hold liquid;
 a pump fluidically coupled to the reservoir;
 a first fluidic conduit configured to couple to a first pair of fluid disconnects of a manifold of the liquid cooling system;
 a second fluidic conduit configured to couple to a second pair of fluid disconnects of the manifold of the liquid cooling system; and a processor communicatively coupled to the pump and configured to:
in a fill mode of the system, drive liquid from the reservoir, through the first fluidic conduit, through the first pair of fluid disconnects, to fluidic channels of the liquid cooling system fluidically coupled to the first pair of fluid disconnects; and
in a drain mode of the system, cause the pump to drive liquid present in the fluidic channels to flow from the fluidic channels, through the first pair of fluid disconnects, through the first fluidic conduit, and to the reservoir.

2. The system of claim 1, the processor further configured to cause the pump to, during the fill mode, cause air present in the fluidic channels to flow from the fluidic channels, through the second pair of fluid disconnects, through the second fluidic conduit, and to the reservoir.

3. The system of claim 1, the processor further configured to cause the pump to, during the drain mode, cause air present in the reservoir to flow from the reservoir, through the second fluidic conduit, through the second pair of fluid disconnects, and to the fluidic channels.

4. The system of claim 1, wherein the pump comprises a peristaltic pump.

5. The system of claim 1, wherein the pump is further configured to communicate information to the processor indicative of a volume of fluid flowing through the pump and the processor is configured to control operation of the pump based on such information.

6. The system of claim 1, wherein a fluid disconnect of at least one of the first pair of fluid disconnects and the second pair of fluid disconnects is a quick disconnect.

7. The system of claim 1, further comprising a check valve fluidically coupled to the first fluidic conduit and configured to open to permit liquid to flow from the pump to the reservoir responsive to a pressure of the first fluidic conduit exceeding a threshold pressure.

8. The system of claim 1, further comprising a check valve integral to the reservoir configured to open to equalize pressure between the reservoir and air ambient to the reservoir responsive to the pressure between the reservoir and air ambient to the reservoir exceeding a threshold pressure.

9. A method for filling and draining a liquid cooling system, comprising:
in a fill mode of the system, causing a pump to drive liquid from a reservoir configured to hold the liquid, through a first fluidic conduit configured to couple to a first pair of fluid disconnects of a manifold of the liquid cooling system, through the first pair of fluid disconnects, to fluidic channels of the liquid cooling system fluidically coupled to the first pair of fluid disconnects, wherein the liquid cooling system further includes a second fluidic conduit configured to couple to a second pair of fluid disconnects of the manifold; and
in a drain mode of the system, causing the pump to drive liquid present in the fluidic channels to flow from the fluidic channels, through the first pair of fluid disconnects, through the first fluidic conduit, and to the reservoir.

10. The method of claim 9, further comprising during the fill mode, causing air present in the fluidic channels to flow from the fluidic channels, through the second pair of fluid disconnects of the manifold of the liquid cooling system, through the second fluidic conduit configured to couple to the second pair of fluid disconnects, and to the reservoir.

11. The method of claim 9, further comprising during the drain mode, causing air present in the reservoir to flow through the second fluidic conduit configured to couple to the second pair of fluid disconnects of the manifold of the liquid cooling system, through the second pair of fluid disconnects, and to the fluidic channels.

12. The method of claim 9, further comprising receiving information from the pump indicative of a volume of fluid flowing through the pump and controlling operation of the pump based on such information.

13. The method of claim 9, wherein a fluid disconnect of at least one of the first pair of fluid disconnects and the second pair of fluid disconnects is a quick disconnect.

14. The method of claim 9, further comprising opening a check valve fluidically coupled to the first fluidic conduit to permit liquid to flow from the pump to the reservoir responsive to a pressure of the first fluidic conduit exceeding a threshold pressure.

15. The method of claim 9, further comprising opening a check valve integral to the reservoir to equalize pressure between the reservoir and air ambient to the reservoir responsive to the pressure between the reservoir and air ambient to the reservoir exceeding a threshold pressure.

16. A method, comprising:
fluidically coupling a reservoir configured to hold liquid to a pump;
fluidically coupling to the pump a first fluidic conduit configured to couple to a first pair of fluid disconnects of a manifold of a liquid cooling system;
fluidically coupling to the reservoir a second pair of fluid disconnects of the manifold of the liquid cooling system; and
communicatively coupling a processor to the pump, wherein the processor is configured to:
in a fill mode of the system, drive liquid from the reservoir, through the first fluidic conduit, through the first pair of fluid disconnects, to fluidic channels of the liquid cooling system fluidically coupled to the first pair of fluid disconnects; and
in a drain mode of the system, cause the pump to drive liquid present in the fluidic channels to flow from the fluidic channels, through the first pair of fluid disconnects, through the first fluidic conduit, and to the reservoir.

17. The method of claim 16, the processor further configured to cause the pump to, during the fill mode, cause air present in the fluidic channels to flow from the fluidic channels, through the second pair of fluid disconnects, through a second fluidic conduit, and to the reservoir.

18. The method of claim 16, the processor further configured to cause the pump to, during the drain mode, cause air present in the reservoir to flow from the reservoir, through a second fluidic conduit, through the second pair of fluid disconnects, and to the fluidic channels.

19. The method of claim 16, wherein the pump comprises a peristaltic pump.

20. The method of claim 16, further comprising communicatively coupling the pump to the processor such that the pump is configured to communicate information to the processor indicative of a volume of fluid flowing through the pump and the processor is configured to control operation of the pump based on such information.

21. The method of claim 16, wherein a fluid disconnect of at least one of the first pair of fluid disconnects and the second pair of fluid disconnects is a quick disconnect.

22. The method of claim 16, further comprising fluidically coupling a check valve to the first fluidic conduit, the check valve configured to open to permit liquid to flow from the pump to the reservoir responsive to a pressure of the first fluidic conduit exceeding a threshold pressure.

23. The method of claim 16, further comprising integrating a check valve in the reservoir, the check valve configured to open to equalize pressure between the reservoir and air ambient to the reservoir responsive to the pressure between the reservoir and air ambient to the reservoir exceeding a threshold pressure.

\* \* \* \* \*